United States Patent [19]
Osaka

[11] Patent Number: 4,729,117
[45] Date of Patent: Mar. 1, 1988

[54] SEMICONDUCTOR MEMORY DEVICE
[75] Inventor: Yoshio Osaka, Kawasaki, Japan
[73] Assignee: Kabushiki Kaisha Toshiba, Kawasaki, Japan
[21] Appl. No.: 841,249
[22] Filed: Mar. 19, 1986
[30] Foreign Application Priority Data Mar. 20, 1985 [JP] Japan ................................. 60-56513
Sep. 30, 1985 [JP] Japan ............................... 60-216483

[51] Int. Cl.$^4$ ...................... G11C 11/40; G11C 13/00
[52] U.S. Cl. ..................................... 365/200; 365/189
[58] Field of Search ............................... 365/200, 189
[56] References Cited
U.S. PATENT DOCUMENTS 4,485,471 11/1984 Singh et al. .......................... 365/200
4,592,024 5/1986 Sakai et al. ........................... 365/200

Primary Examiner—Terrell W. Fears
Attorney, Agent, or Firm—Finnegan, Henderson, Farabow, Garrett & Dunner

[57] ABSTRACT

A semiconductor memory device is comprised of memory cells arranged in a matrix fashion; defective row line detect circuits for producing logic "1" when a defective row line is selectd to which a detective cell is connected; defective column line detect circuits for producing a logical "1" signal when a defective column line is selected to which a defective cell is connected; an AND gate for detecting the selection of defective cell using a logic value of the output signals from defective row and column line detect circuits; and an exclusive OR gate for exclusively ORing the read out data signal and the output signal from the AND gate to correct the defective data.

2 Claims, 4 Drawing Figures

F I G. 1
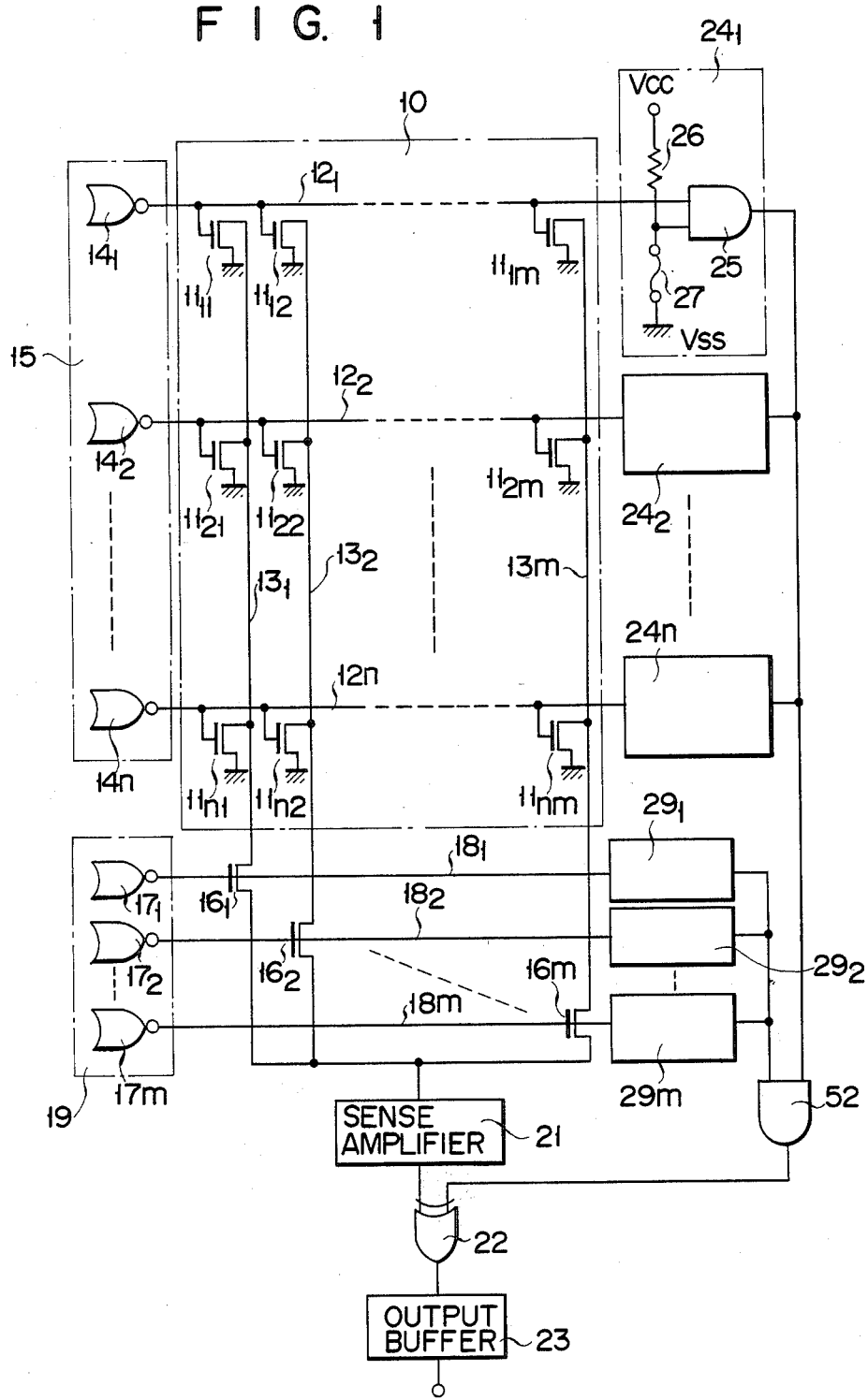

SEMICONDUCTOR MEMORY DEVICE

BACKGROUND OF THE INVENTION

This invention relates to a semiconductor memory device, and more particularly a semiconductor memory device capable of saving read only memory devices (ROMs) containing defective cells.

With increase of memory capacity of the memory devices, a production yield of the memory devices is reduced due to disconnection of row and column lines, and crystal defects, and the like. One of the measures thus far taken for this problem is to incorporate a redundancy circuit into the memory chip. In this measure, normal memory cells of the redundancy circuit are used for defective cells of the memory device if the defective cells are found. The measure, however, has a disadvantage in that replacing of the defective cell by the normal cell needs time and trouble. Another measure as has been proposed is based on the error code correct (ECC) system which has been employed in large computers for check and correction of error code. This approach has practically been employed in some manufacturers. In the measure, the memory cells for storing parity bits are additionally used. The contents of the parity bits are referenced to for defective bits detection if data bits (for example, 8 bits) contain a defective bit or bits. In a mask ROM of a large capacity, for example, 1 M bits or more, approximately 20% of the total data bits is needed for parity memory cells. This fact implies increase of memory chip size. Further, in a read out mode, an operation circuit operates for error check and correction, so that the access time is long.

SUMMARY OF THE INVENTION

Accordingly, an object of the present invention is to provide a semiconductor memory device which requires a slight increase of the chip size and a short access time for defective cell measure.

According to the invention, there is provided a semiconductor memory device comprising:

a memory array comprising a plurality of memory cells arranged in a matrix fashion;

a row decoder for selecting a row line;

a column decoder for selecting a column line;

means for detecting the selection of a defective cell;

means for sensing data of the selected memory cell;

said detect means comprises:

row detect circuits connected to the output terminals of said row decoder, said circuits being so programmed that they detect the selection of the row line when a defective cell is contained in the corresponding row line;

column detect circuits connected to the output terminals of said column decoder, said circuits being so programmed that they detect the selection of the column line when a defective cell is contained in the corresponding column line;

means connected to said row and column detect circuits to receive output signals thereof, for detecting the selection of the defective cell using the logic values of output signals of said row and column detect circuits; and means connected to said sense means and said selection detect means to receive output signals thereof, for inverting the logic value of the data sensed by said sense means on the basis of the logic value of the output signal of said cell selection detecting means.

BRIEF DESCRIPTION OF THE DRAWINGS

FIG. 1 shows a diagram of a read only memory according to one embodiment of this invention.

DETAILED DESCRIPTION OF THE PREFERRED EMBODIMENTS

Figure 2:
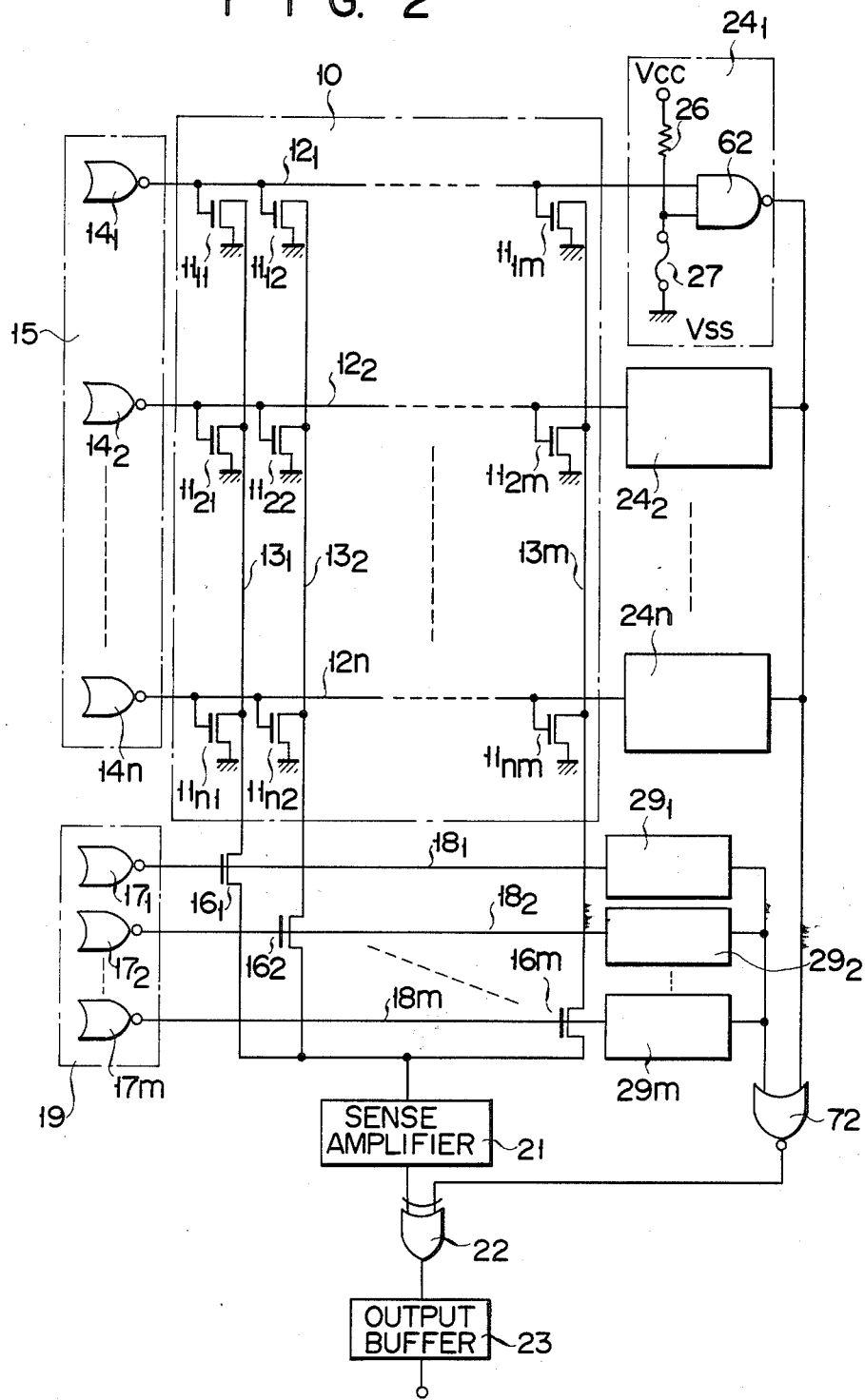
FIGS. 2 to 4 show circuit diagrams of ROMs according to other embodiments of the present invention.

Preferred embodiments of the present invention will be described referring to the accompanying drawings.

In FIG. 1, memory cell array 10 is constructed with a plurality of MOS (metal oxide semiconductor) memory cells $11_{11}$ to $11nm$ arrayed in a matrix fashion. The gates of memory cells $11_{11}$ to $11nm$ are respectively connected to corresponding row lines $12_1$ to $12n$ which are connected to the output terminals of row decoder 15. The drains of the memory cells are connected to corresponding row lines $13_1$ to $13m$, respectively. The sources of them are all connected to ground Vss. Row decoder 15 includes a plurality of NOR gates $14_1$ to $14n$ whose output terminals serve as the output terminals of row decoder 15. Row lines $12_1$ to $12n$ are connected to the output terminals of NOR gates $14_1$ to $14n$. Row lines $13_1$ to $13m$ are connected to the input terminal of sense amplifier 21, through MOS transistors $16_1$ to $16m$ for column line selection. The gates of transistors $16_1$ to $16m$ for column line selection are respectively connected to corresponding row select lines $18_1$ to $18m$. Column decoder 19 includes a plurality of NOR gates $17_1$ to $17m$. The output terminals of NOR gates $17_1$ to $17m$ serve as the output terminals of column decoder 19. Row select lines $18_1$ to $18m$ are connected to the output terminals of NOR gates $17_1$ to $17m$. Row lines $13_1$ to $13m$ are connected together and to sense amplifier 21. The output terminals, i.e. row lines $12_1$ to $12n$, are connected to row line detect circuits $24_1$ to $24m$, respectively. Each of row line detect circuits $24_1$ to $24m$ is comprised of AND gate 25 with its first input terminal connecting to the corresponding row line, load resistor 26 inserted between the second input terminal of gate 25 and power source potential Vcc, and fuse 27 made of polysilicon layer, for example, inserted between the input terminal of AND gate 25 and ground. The output terminal of AND gate 25 constitutes the output terminal of the detect circuit.

The output terminals of NOR gates $17_1$ to $17m$, i.e. row select lines $18_1$ to $18m$, are connected to defective row line detect circuits $29_1$ to $29n$, respectively. Defective row line detect circuits $29_1$ to $29n$ have substantially the arrangement as that of the row line detect circuits $24_1$ to $24m$, with some exception. In row line detect circuits $24_1$ to $24m$, the first input terminal of AND gate 25 is connected to row lines $12_1$ to $12n$, while in defective row line detect circuits $29_1$ to $29n$, it is connected to transistors $16_1$ to $16m$. The output terminals of row line detect circuits $24_1$ to $24m$ are connected together and to the first input terminal of AND gate 52. The output terminals of defective row line detect circuits $29_1$ to $29n$ are similarly connected together and the second input terminal of AND gate 52. The output terminal of AND gate 52 is connected to the first input terminal of exclusive OR gate 22. The second input terminal of gate 22 is connected to the output terminal of sense amplifier 21, and receives data sensed by sense amplifier 21. The output terminal of exclusive OR gate 22 is connected to the input terminal of output buffer 23. From this terminal, data is obtained.

The semiconductor memory devices thus arranged, after manufactured, are subjected to the check to see if the devices contain defective cells. The defective cell check is performed in a well known manner. For example, a predetermined address signal is applied to the memory device. Then, the data as read out responsive to the address signal is checked if that data is correct or not. However, such method is not essential for this invention. The fuse of the detect circuit connected to the row line containing a defective cell is burned out by a known method, for example, radiating it with laser beam or feeding large current to it. By the burning out of the fuse, presence of the defective cell in the row line is registered, or programmed, into the detect circuit. By the burning out of fuse, a defect of the row line per se, for example, its disconnection, may be registered. The fuse of the detect circuit connected to the column line select line for selecting the column line containing a defective cell, may also be burned out in the known manner. By the burning out of the fuse, presence of detective cell in the column line is registered, or programmed, into the detect circuit. By this burning out of the fuse, a defect of the column line per se, i.e. disconnection, may be registered.

The operation of the ROM device thus arranged will be described.

Let us assume that a memory cell $11_{11}$ connected to row line $12_1$ and column line $13_1$ is defective. In this case, the fuse 27 in the row line detect circuit $24_1$ connected to row line $12_1$ has been burned out at the time of inspecting the memory device. The fuse (not shown) in defective row line detect circuit $29_1$ connected to row line $13_1$ has also be burned out at the time of the inspection.

It is now assumed that the memory cell $11_{11}$ is designated by an address signal applied to row decoder 15 and column decoder 19. Row decoder 14 enables row line $12_1$ to go high ("1") in logic level. The high level signal is input to the first input terminal of AND gate 25 of row line detect circuit $24_1$. Since fuse 27 of detect circuit $24_1$ has been burned out, a high level signal (power source potential Vcc) has been input through load resistor 26 to the second input terminal of AND gate 25. Accordingly, when row line $12_1$ is enabled, the input terminals of AND gate 25 are both high, and its output also goes high. The high level output signal is the output signal of the detect circuit, and input to the first input terminal of AND gate 52. At this time, in the defective row line detect circuit of which the fuse is not burned out, the input terminal of AND gate of each of these circuits is set at low level, that is, grounded through the fuse. Therefore, the outputs of the AND gates are low in level irrespective of the logical state in the row lines connected to those detect circuits.

As recalled, the memory cell $11_{11}$ has been designated, column decoder 19 enables column select line $18_1$ to go high in logic level. Accordingly, through the operation related to detect circuit $25_1$, the output signal of column line detect circuit $29_1$ connected to column line select line $13_1$ goes high. The high level output signal is input to the second input terminal of AND gate 52. Then, AND gate 52 produces a high level signal which in turn is applied to the first input terminal of exclusive OR gate.

Since row line $12_1$ and column line $13_1$ are now enabled, error data in memory cell $11_{11}$ as a defective cell is sensed by sense amplifier 21, and is input to the second input terminal of exclusive OR gate 22. Since the second input terminal of exclusive OR gate 22 is high, the error data is inverted in level, that is, corrected, and is output through output buffer 23.

In this way, the defective cell contained memory device is saved.

When an address signal to select a nondefective or correct cell is applied to the memory device, the defective row and column line detect circuits connected to the correct cell have never high logic level. Therefore, the output signal of AND gate 52 is low ("0") in logic level. The data read out by sense amplifier 21 is output through output buffer 23, while keeping its logic state.

Description will be given of a case that memory cell $11_{12}$ is also defective connecting to the same row line as that coupled with the defective cell $11_{11}$ as mentioned above. In this case, the fuse in detect circuit $29_2$ is also burned out. Detect circuit $29_2$ is connected to column line select line $18_2$, which is for selecting column line $12_2$ coupled with that defective memory cell $11_{12}$. With detect circuit $29_2$ thus programmed, if defective cell $11_{12}$ is designated, both the output signals of detect circuits $24_1$ and $29_1$ go high. As a result, the error data read out from defective cell $11_{12}$ by sense amplifier 22 is inverted by exclusive OR gate 22, and is output as correct data. As seen from the foregoing description, if the memory cells connected to each row line are all defective, all of the defective cells coupled with the row line can be detected by merely burning out the fuse in the detect circuit connected thereto. This is true for the memory cells connected to one column line. For example, if another memory cell $11_{21}$ connected to the same column line as that connected to memory cell $11_{11}$ is defective, the fuse is disconnected, which is contained in detect circuit $24_2$ connected to row line $12_2$ containing that defective memory cell $11_{21}$. With the detect circuit $24_2$ thus programmed, when cell $11_{21}$ is specified, both of the output signals of detect circuits $24_2$ and $29_1$ go high. As seen from the operation as previously described, the error data read out from defective cell $11_{12}$ by sense amplifier 21 is corrected by exclusive OR gate 22. As seen from the foregoing, even if all of the memory cells are defective, these defective cells can be detected by merely burning out the fuse in the detection circuit connected to the column line selection line for the column line.

Increase of chip size resulting from additional provision of detect circuits $24_1$ and $29_1$ is only 2 to 3%. Time taken when the data read out by sense amplifier 21 is input output buffer 23 through exclusive OR gate 22, is relatively short, and therefore access time is short. This fact indicates that high speed operation of this memory device is feasible.

FIG. 2 shows a second embodiment of this invention. In this embodiment, AND gates 25 in detect circuits $24_1$ to $24n$ and $29_1$ to $29m$ are replaced by NAND gates 62. AND gate 52 is replaced by NOR gate 72. The remaining arrangement of this embodiment is substantially equal to that of the first embodiment.

If memory cell $11_{11}$ is specified and it is defective, the output signals of detect circuits $24_1$ and $29_1$ are both low in logic level. The low output signal is input to the first input terminal of NOR gate 71. Gate 72 produces a high level signal, which in turn is input to the first input terminal of exclusive OR gate 22. The error data read out from memory cell $11_{11}$ by sense amplifier 21 is level inverted, by exclusive OR gate 22, into correct data. The corrected data is output through output buffer 23.

The same effects as of the first embodiment can be attained in this embodiment.

Figure 3:
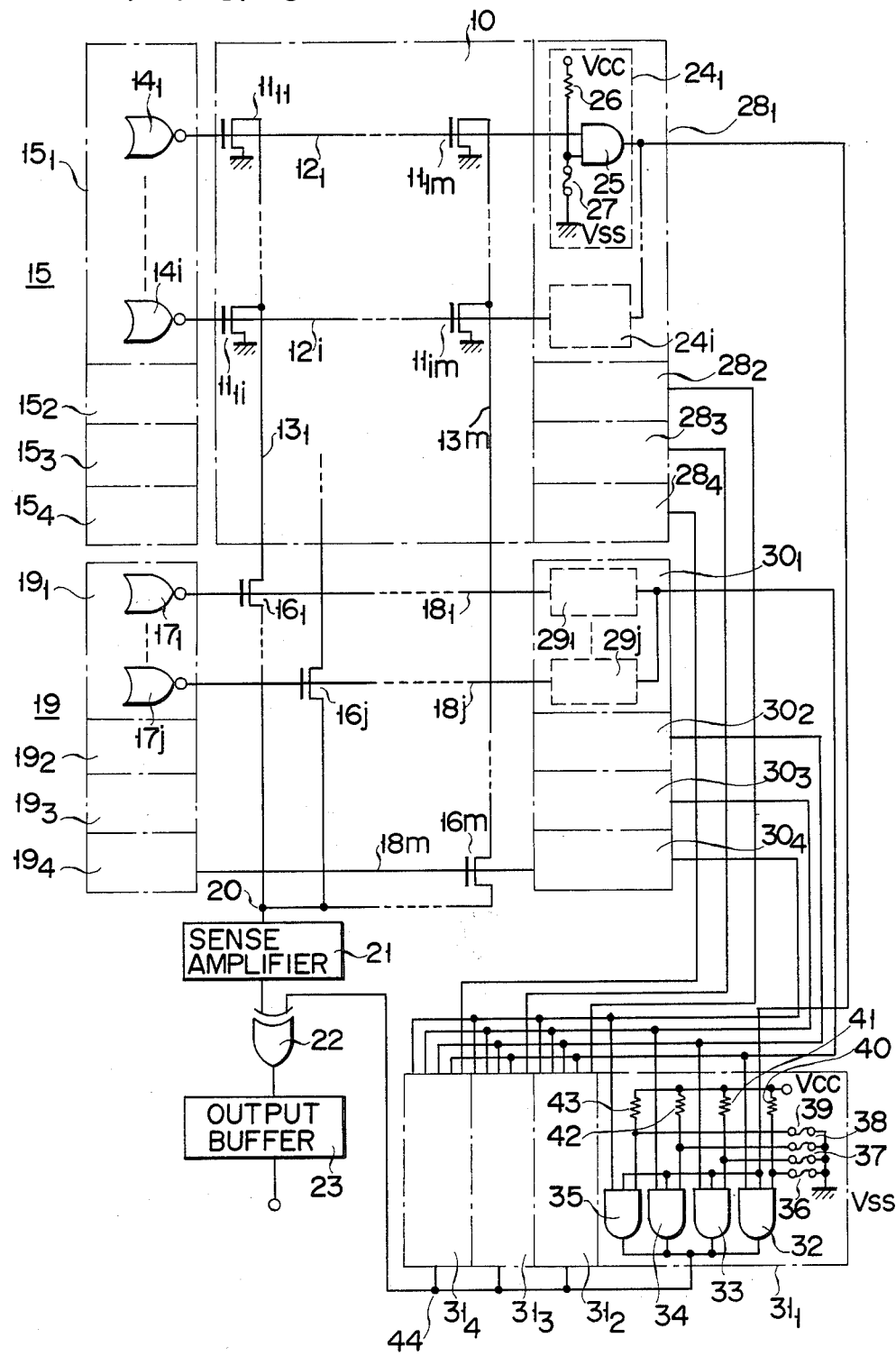

FIG. 3 shows a third embodiment of this invention. In this embodiment, row decoder 15 is segmented into four decoders $15_1$ to $15_4$. Row decoder $15_1$ is constructed with NOR gates $14_1$ to $14_i$. Row decoder $15_2$ is constructed with NOR gates $14_{i+1}$ to $14_{2i}$ (not shown). The remaining row decoders $15_3$ and $15_4$ are similarly constructed.

Column decoder 19 is also segmented into four column decoders $19_1$ to $19_4$. Column decoder $19_1$ is constructed with NOR gates $17_1$ to $17_j$. Column decoder $19_2$ is constructed with NOR gates $17_{j+1}$ to $17_{2j}$. The remaining column decoders $19_3$ and $19_4$ are similarly constructed.

Defective row line detect circuits $24_1$ to $24_m$ are segmented into four groups $28_1$ to $28_4$, corresponding to the segmentation of row decoder 15. Detect circuit group $28_1$ is constructed with detect circuits $24_1$ to $24_i$. Detect circuit group $28_2$ is constructed with row line detect circuits $24_{i+1}$ to $24_{2i}$ (not shown). The remaining detect circuit groups $28_3$ and $28_4$ are similarly constructed.

Defective column line detect circuits $29_1$ to $29_n$ are segmented into four groups $30_1$ to $30_3$, copresponding to the segmentation of the column decoder. Detect circuit group $30_1$ is comprised of detect circuits $20_1$ to $29_i$. Detect circuit group $30_2$ is comprised of detect circuits $29_{j+1}$ to $29_{2j}$ (not shown). The remaining detect circuit groups are similarly constructed.

As described above, each of detect circuit $24_1$ to $24_m$ is comprised of AND gate 25 with the first input terminal connected to the corresponding row line, load resistor 26 inserted between the second input terminal of AND gate 25 and power source potential Vcc, and fuse 27 placed between the input terminal of AND gate 25 and ground.

The output terminals of the detect circuits constituting each detect circuit group $28_1$ to $28_4$ are connected together. The detect circuits $24_{i+1}$ to $24_{2i}$ (not shown) forming detect circuit group $28_2$ are connected together at the output terminals. The same thing is true for the output terminals of the remaining detect circuits.

Similarly, detect circuits $29_1$ to $29_j$ forming group $30_1$ have the output terminals connected together. The output terminals of detect circuits $29_{j+1}$ to $29_{2j}$ (not shown) forming group $30_2$ are connected together. This is true for the output terminal connection of the remaining detect circuits $30_3$ to $30_4$.

The output terminals of detect circuit groups $28_1$ to $28_4$ and $30_1$ to $30_4$ are connected to group select circuits $31_1$ to $31_4$. Each select circuit $31_1$ to $31_4$ is comprised of three-input AND gates 32 to 35, fuses 36 to 39, and load resistors 40 to 43. In each select circuit, the first input terminals of AND gates 32 to 35 are connected to the second input terminals of load resistors 40 to 43 which are connected at the first input terminals to power source potential Vcc. The first input terminals of AND gates 32 to 35 are connected the other ends of fuses 37 to 39 connected at one ends to ground. The second input terminals of AND gates 32 to 35 of select circuit $31_1$ are connected together and to the output terminal of defective row line detect circuit $28_1$. The third input terminals of these gates are connected to the output terminals of defective column line detect circuits $30_1$ to $30_4$. The output terminal of detect circuit $28_2$ is connected to the second input terminals of AND gates 32 to 35 of column group select circuit $31_2$. The third input terminals of AND gates 32 to 35 of select circuit $31_2$ are connected to the output terminals of detect circuits $30_1$ to $30_4$. The second input terminals of AND gates 32 to 35 of group select circuit $31_3$ are connected to the output terminals of detect circuits $30_1$ to $30_4$. The second input terminals of AND gates 32 to 35 of column group select circuit $31_4$ are connected to the output terminal of defective address detect circuit $28_4$. The third input terminals of AND gates 32 to 35 of select circuit $31_3$ are connected to the output terminals of detect circuits $31_1$ to $31_4$. The output terminals of all of AND gates 32 to 35 of column group select circuits $31_1$ to $31_4$ are connected together. This common connection point 44 is connected to the second input terminal of exclusive OR circuit 22 for receiving at the input terminal the data sensed by sense amplifier 22.

The operation of the memory device thus arranged will be given. It is assumed now that a memory cell $11_{11}$ placed at the cross point of row and column lines $12_1$ and $13_1$ is defective. In this case, the fuse 27 in the detect circuit 24 of group $28_1$ and the fuse 27 in the detect circuit of group $30_1$ has been burned out. Further, in group select circuit 27, fuse 36 has also been burned out at the time of product inspection. Fuse 36 is connected to the AND gate 32 which receives the output signals of groups $28_1$ and $30_1$.

Since fuses 27 have been burned out, the defective cell $11_{11}$ is selected by row and column decoders $15_1$ and $19_1$. When error data is read out from the defective memory cell, the output signals of detect circuit groups $28_1$ and $30_1$ are both logic "1". Since the fuse 36 in group select circuit $31_1$ supplied with the output signals of groups $28_1$ and $30_1$ has been burned out, the first input terminal of AND gate 32 in circuit $31_1$ is set at logic "1" by load resistor 40. Therefore, when defective cell $11_{11}$ is selected, the output signal of AND gate 32 is logic "1". This signal is applied to the second input terminal of exclusive OR gate 22. The error data from the defective cell is inverted in level by exclusive OR gate 22, that is, corrected. The corrected data is output through output buffer 23.

When the correct cell is designated, the output signal of column select circuit $31_1$ to $31_4$ goes low, and the data as sensed by the sense amplifier 21 passes through exclusive OR gate, while keeping its logic state, and is output through buffer 23.

According to the FIG. 3 embodiment, the defective cells equal in number to the number of defective row line detect circuits $28_1$ to $28_4$ or defective column detect circuit $30_1$ to $30_4$ can be saved. Further, the defective cells at an address connected to the different row or column line can be saved. Unlike the ECC system using parity bits, there is no need for the memory for storing parity bits. For this reason, increase of the chip size due to the additional use of the circuit with a correction function may be limited to satisfactorily be small, when compared with the ECC system. Further, there is no need for operation of the operation circuit every time data is read out, eliminating the factor lengthening the access time. Further, for saving a single defective cell, three fuses are merely burned out. The defective cell saving work is simple.

Figure 4:
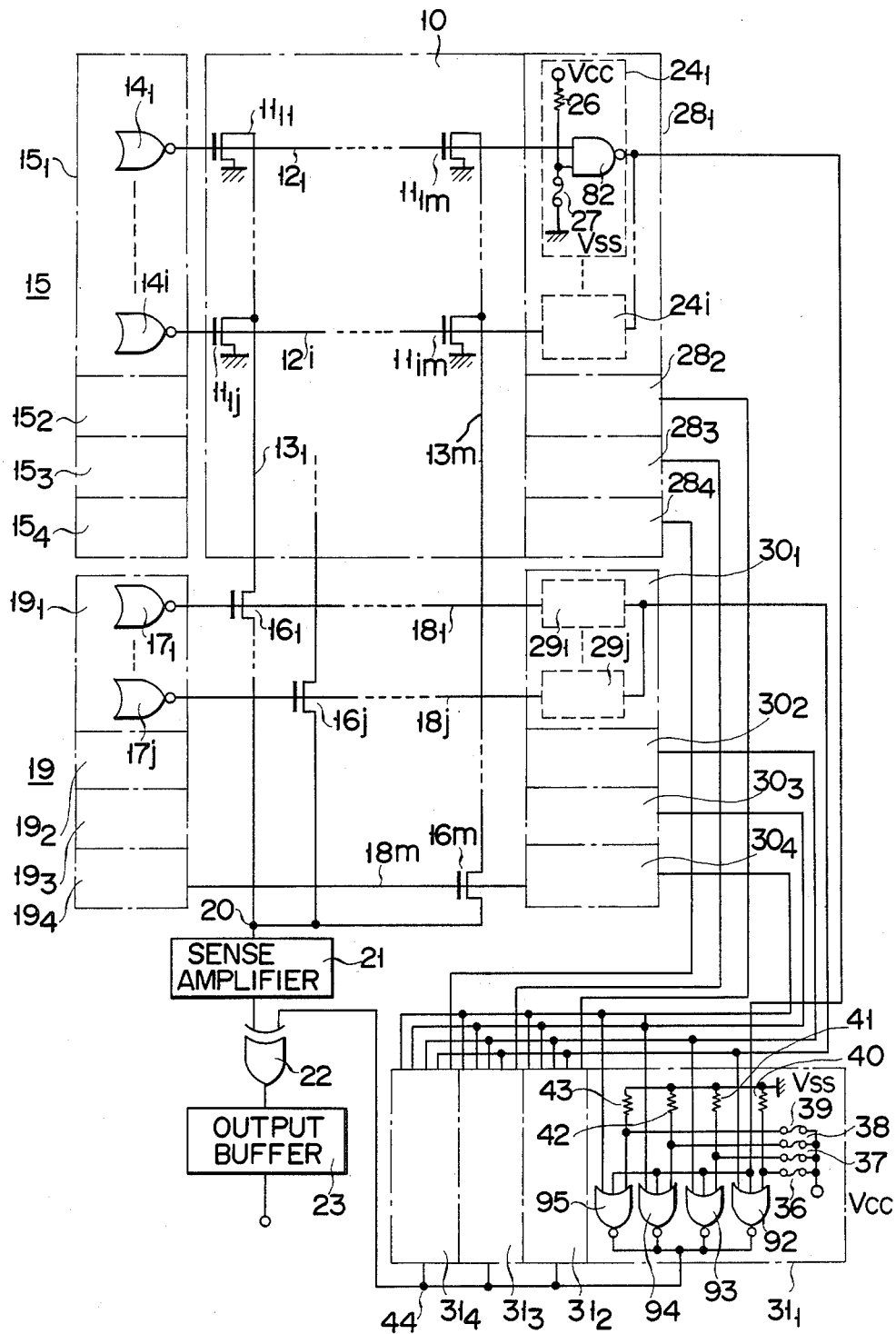

FIG. 4 shows a fourth embodiment of this invention. The AND gates 25 in FIG. 3 are replaced by NAND gates 82. The AND gates 32 to 35 in column line select circuits $31_1$ to $31_4$ are replaced by NOR gates 92 to 95.

One of the terminals of each NOR gate 92 to 95 is connected to Vss through resistors 40 to 43 and to Vcc through fuses 36 to 39. The remaining portion of the circuit arrangement is substantially equal to that of the FIG. 3 embodiment.

When defective cell $11_{11}$ is designated, the output signals of detect circuits $24_1$ and $29_1$ are both logical "0", and are input to the input terminals of NOR gates 92 to 95. As a result, the outputs of select circuits $31_1$ to $31_4$ are logical "1", and this signal is led to the first input terminal of exclusive OR gate 22. As seen from the foregoing description, the error data read out of the defective memory cell $11_1$ is inverted by exclusive OR gate 22, that is, corrected and output through buffer 23.

It should be noted that the present invention is not limited to the specific embodiments as mentioned above, but may variously be modified and changed within the spirit of this invention. While the row and column decoders 15 and 19 are segmented into four, the number of these segmentations may appropriately be selected according to a desired number of defective cells to be saved.

As described above, according to the present invention, there is provided a semiconductor memory device which requires a minimun increase of chip size for defective cell saving circuit, having a small access time.

What is claimed is:

1. A semiconductor memory device having a memory array with a plurality of memory cells arranged in a matrix of row and column lines wherein the memory cells are addressed by selecting row and column lines and where some of the memory cells may be defective; a row decoder for selecting a row line; a column decoder for selecting a column line, and a selected memory cell being connected between selected row and column lines; detect means for detecting a defective memory cell connected between selected row and column lines; and sense means for sensing the data of a detected defective memory cell; wherein said detect means comprises:

row detect circuits connected to the output of said row decoder, said row detect circuits being programmed to detect a selected row line having a defective cell;

column detect circuits connected to the output of said column decoder, said column detect circuits being programmed to detect a selected column line having a defective cell;

means connected to said row and column detect circuits to receive the outputs thereof for detecting the selection of a defective memory cell based on the logic values of the outputs of said row and column detect circuits; and means connected to said sense means and said detect means to receive the outputs thereof and for inverting the logic value of the data sensed by said sense means based on the logic value of the output of said detect means.

2. A semiconductor memory device according to claim 1, wherein:

said row decoder comprises a plurality of row decoders divided into a plurality of row decoder segments, said column decoder comprises a plurality of column decoders divided into a plurality of column decoder segments, and wherein said row detect circuits are divided into a plurality of row detect circuit segments corresponding to said row decoder segments, the outputs of said row detect circuits each constituting said row detect circuit segments and being interconnected; and said column detect circuits are divided into a plurality of segments corresponding to said column decoder segments, the outputs of said column detect circuits each constituting said column detect circuit segments and being interconnected; and said detect means comprises a plurality of selection detect sections, said selection detect sections selectively being connected to said row and column decoder segments for detecting the selection of the defective cells based on the logic levels of output signals of the selected row and column decoder segments.

* * * * *